US008409407B2

(12) United States Patent
Halloran et al.

(10) Patent No.: US 8,409,407 B2
(45) Date of Patent: Apr. 2, 2013

(54) METHODS FOR HIGH-RATE SPUTTERING OF A COMPOUND SEMICONDUCTOR ON LARGE AREA SUBSTRATES

(75) Inventors: Sean Timothy Halloran, Denver, CO (US); Robert Dwayne Gossman, Aurora, CO (US); Russell Weldon Black, Longmont, CO (US)

(73) Assignee: Primestar Solar, Inc., Arvada, CO (US)

( * ) Notice: Subject to any disclaimer, the term of this patent is extended or adjusted under 35 U.S.C. 154(b) by 386 days.

(21) Appl. No.: 12/765,268

(22) Filed: Apr. 22, 2010

(65) Prior Publication Data
US 2011/0259732 A1 Oct. 27, 2011

(51) Int. Cl.
*C23C 14/00* (2006.01)
*C23C 14/32* (2006.01)
*C25B 9/00* (2006.01)
*C25B 11/00* (2006.01)
*C25B 13/00* (2006.01)

(52) U.S. Cl. ......... 204/192.26; 204/192.15; 204/192.27; 204/192.28; 204/298.08; 204/298.12

(58) Field of Classification Search ............. 204/192.26, 204/192.27, 192.28, 192.29, 192.15, 298.08, 204/298.12
See application file for complete search history.

(56) References Cited

U.S. PATENT DOCUMENTS

| | | | |
|---|---|---|---|
| 4,651,674 A | 3/1987 | Hayashi et al. | |
| 4,732,110 A | 3/1988 | Parsons | |
| 5,151,133 A | 9/1992 | Ohmine et al. | |
| 5,288,515 A | 2/1994 | Nakamura et al. | |
| 5,372,646 A | 12/1994 | Foote et al. | |
| 5,393,675 A * | 2/1995 | Compaan | 438/95 |
| 5,800,616 A | 9/1998 | Persyn | |
| 6,058,740 A | 5/2000 | McMaster et al. | |
| 6,319,321 B1 | 11/2001 | Hiraga et al. | |
| 6,435,865 B1 | 8/2002 | Tseng et al. | |
| 6,500,690 B1 * | 12/2002 | Yamagishi et al. | 438/57 |
| 6,719,848 B2 | 4/2004 | Faykosh et al. | |

(Continued)

OTHER PUBLICATIONS

Bender A et al: "X-ray reflectivity study of r.f.-sputtered thin Si02 films", Thin Solid Films, Elsevier-Sequoia S.A.Lausanne, CH, vol. 229, No. 1, Jun. 5, 1993, pp. 29-32, XP025776821.

(Continued)

*Primary Examiner* — Nicholas A Smith
*Assistant Examiner* — Michael Band
(74) *Attorney, Agent, or Firm* — Dority & Manning, P.A.

(57) ABSTRACT

Methods are generally provided for sputtering thin films on individual substrates. Individual substrates can be conveyed into a vacuum chamber to draw a sputtering pressure that is less than about 50 mTorr. Then, the individual substrates can be conveyed into a sputtering chamber and past a planar magnetron continuously sputtering a target by an ionized gas at the sputtering pressure such that a thin film is formed on a surface of the individual substrate. The target is subjected to a high frequency power having a frequency from about 400 kHz to about 4 MHz at power levels of greater than about 1 kW. In one particular embodiment, the method can be generally directed to sputtering thin films on individual substrates defining a surface having a surface area of about 1000 $cm^2$ to about 2500 $cm^2$.

20 Claims, 5 Drawing Sheets

U.S. PATENT DOCUMENTS

| | | |
|---|---|---|
| 6,827,788 B2 | 12/2004 | Takahashi |
| 7,211,462 B2 | 5/2007 | Romeo et al. |
| 2003/0184893 A1* | 10/2003 | Lu et al. .................. 359/883 |
| 2005/0009228 A1 | 1/2005 | Wu et al. |
| 2007/0218623 A1* | 9/2007 | Chua et al. .................. 438/240 |
| 2009/0014065 A1 | 1/2009 | Mueller |
| 2009/0127101 A1 | 5/2009 | Nauman et al. |
| 2009/0194165 A1 | 8/2009 | Murphy et al. |
| 2010/0314244 A1* | 12/2010 | Brown et al. ............ 204/192.11 |

OTHER PUBLICATIONS

"Radio-frequency-magnetron-sputtered CdS/CdTe solar cells on soda-lime glass", Applied Physics Letters, AIP, American Institute of Physics, Melville, NY, US, vol. 69, No. 20, Nov. 11, 1996, pp. 3045-3047, XP012016588.

EP Search Report issued in connection with corresponding EP Patent Application No. 11163134.7 filed on Apr. 20, 2011.

* cited by examiner

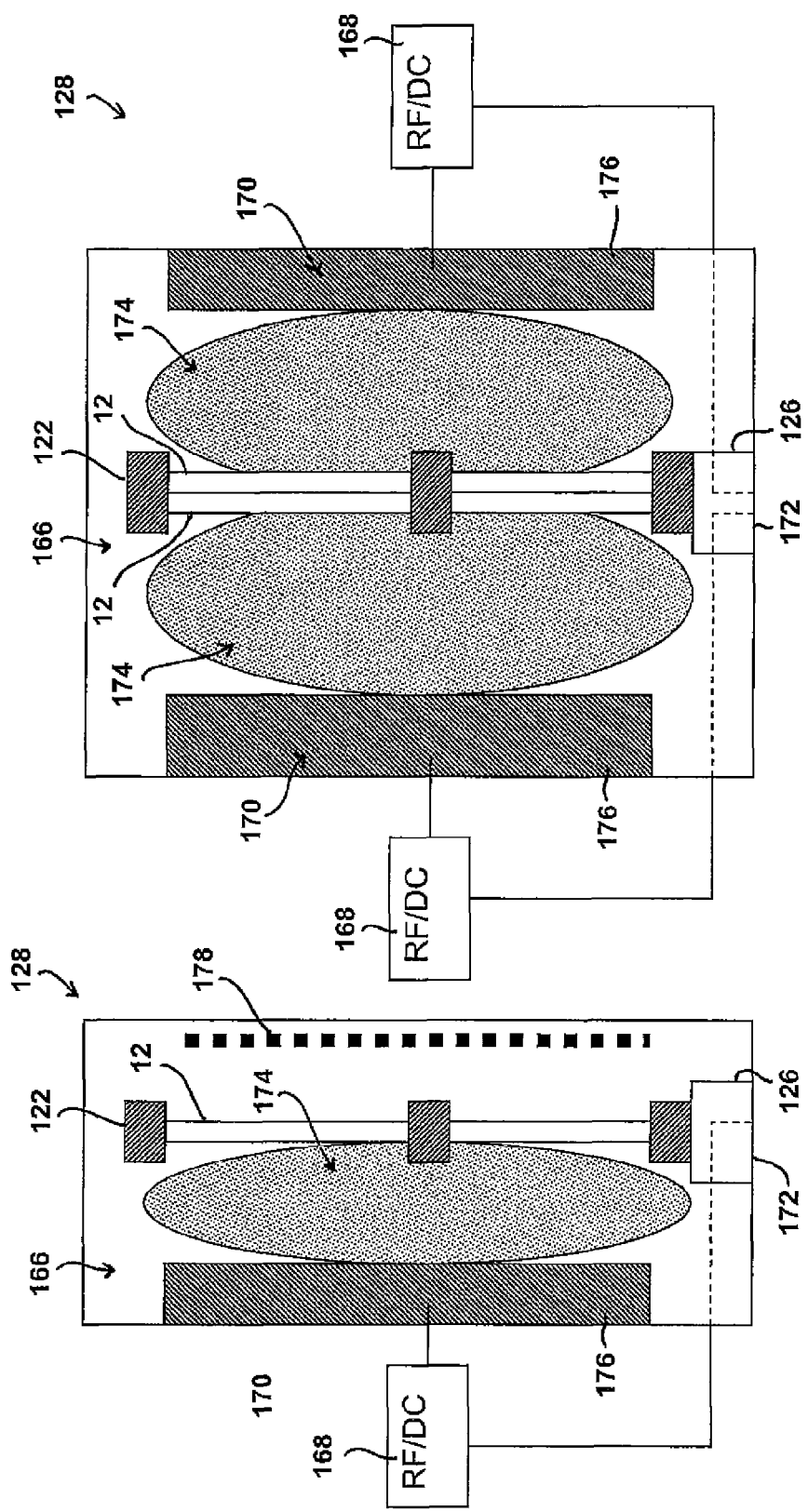

METHODS FOR HIGH-RATE SPUTTERING OF A COMPOUND SEMICONDUCTOR ON LARGE AREA SUBSTRATES

FIELD OF THE INVENTION

The subject matter disclosed herein relates generally to methods of sputtering thin films on a substrate. More particularly, the subject matter disclosed herein relates to methods of high-rate sputtering thin films on large area substrate.

BACKGROUND OF THE INVENTION

Thin film photovoltaic (PV) modules (also referred to as "solar panels" or "solar modules") are gaining wide acceptance and interest in the industry, particularly modules based on cadmium telluride (CdTe) paired with cadmium sulfide (CdS) as the photo-reactive components. CdTe is a semiconductor material having characteristics particularly suited for conversion of solar energy (sunlight) to electricity. For example, CdTe has an energy bandgap of 1.45 eV, which enables it to convert more energy from the solar spectrum as compared to lower bandgap (1.1 eV) semiconductor materials historically used in solar cell applications. Also, CdTe converts energy more efficiently in lower or diffuse light conditions as compared to the lower bandgap materials and, thus, has a longer effective conversion time over the course of a day or in low-light (e.g., cloudy) conditions as compared to other conventional materials.

Typically, CdTe PV modules include multiple film layers deposited on a glass substrate before deposition of the CdTe layer. For example, a transparent conductive oxide (TCO) layer is first deposited onto the surface of the glass substrate, and a resistive transparent buffer (RTB) layer is then applied on the TCO layer. The RTB layer may be a zinc-tin oxide (ZTO) layer and may be referred to as a "ZTO layer." A cadmium sulfide (CdS) layer is applied on the RTB layer. These various layers may be applied in a conventional sputtering deposition process that involves ejecting material from a target (i.e., the material source), and depositing the ejected material onto the substrate to form the film.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner. The capital costs associated with production of PV modules, particularly the machinery and time needed for deposition of the multiple thin film layers discussed above, is a primary commercial consideration.

In particular, sputtering from a semiconducting target that is resistive in nature (e.g., cadmium sulfide) can be difficult to implement at a high rate with sufficient uniformity for mass production of PV devices, particularly when the target has a relatively large surface area.

Accordingly, there exists an ongoing need in the industry for an improved system for economically feasible and efficient large scale production of PV modules, particularly CdTe based modules.

BRIEF DESCRIPTION OF THE INVENTION

Aspects and advantages of the invention will be set forth in part in the following description, or may be obvious from the description, or may be learned through practice of the invention.

Methods are generally provided for sputtering thin films on individual substrates. Individual substrates can be conveyed into a vacuum chamber to draw a sputtering pressure that is less than about 50 mTorr. Then, the individual substrates can be conveyed into a sputtering chamber and past a planar magnetron continuously sputtering a target by an ionized gas at the sputtering pressure such that a thin film is formed on a surface of the individual substrate. The target is subjected to a high frequency power having a frequency from about 400 kHz to about 4 MHz at power levels of greater than about 1 kW.

In one particular embodiment, the method can be generally directed to sputtering thin films on individual substrates defining a surface having a surface area of about 1000 $cm^2$ to about 2500 $cm^2$. For instance, the individual substrates can be conveyed into a vacuum chamber to draw a sputtering pressure that is less than about 50 mTorr and heated to a sputtering temperature of about 50° C. to about 200° C. The individual substrates can be conveyed into a sputtering chamber and past a planar magnetron continuously sputtering a target by an ionized gas at the sputtering pressure such that a thin film is formed on the surface of the individual substrate. The substrates can be continuously conveyed at a substantially constant linear conveyance rate while sputtering such that the thin film formed on the surface of the individual substrate has an average thickness of about 50 nm to about 250 nm with a non-uniformity of about 7% to about 15% of the average thickness. The target can be subjected to a high frequency power having a frequency from about 400 kHz to about 4 MHz at power levels of greater than about 1 kW.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which:

FIG. 6 is diagrammatic view of an embodiment of a sputtering chamber for deposition of a thin film on a substrate; and, FIG. 7 is a diagrammatic view of an alternative embodiment of a sputtering chamber.

Figure 1:
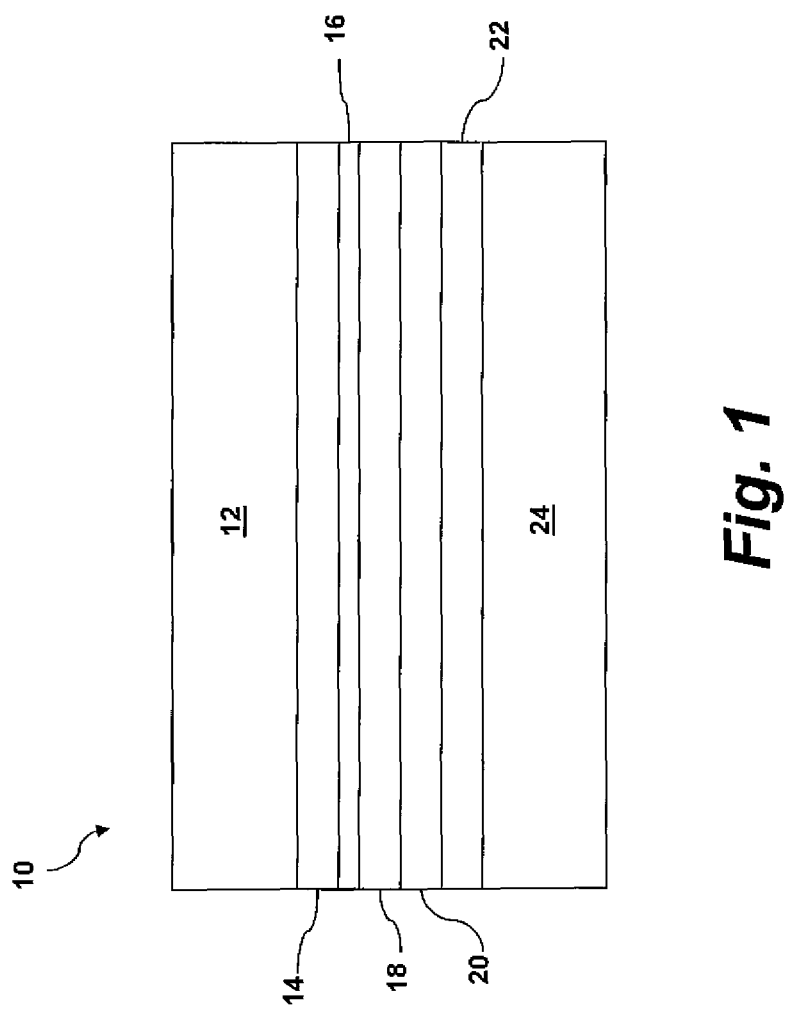
FIG. 1 is a cross-sectional view of an exemplary CdTe photovoltaic module.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Methods of sputtering a thin film onto individual substrates are generally provided. The methods are particularly suitable for sputtering from targets of a semiconductor material (e.g., cadmium sulfide) onto the individual substrates. The methods can deposit the thin film layers with acceptable uniformity across the surface of the substrate, even on relatively large substrates (e.g., defining a surface area of greater than about 1000 cm$^2$, such as about 1500 cm$^2$ to about 2500 cm$^2$). Thus, the presently disclosed methods can be suitable for large-scale manufacturing processes.

For instance, the thin film formed on the surface of the individual substrate can have a non-uniformity less than about 20% of the average thickness (e.g., about 7% to about 15% of the average thickness). The sputtered layers can have an average thickness of about 50 nm to about 250 nm (e.g., about 70 nm to about 100 nm).

The thin film layers, particularly when sputtered from semiconducting targets, can be formed at relatively low frequency RF power sources. For example, in one particular embodiment, the frequency of the RF power source applied to the sputtering chamber can be about 400 kHz to about 4 MHz at power levels of greater than about 1 kW, such as about 1 MHz to about 3 MHz at power levels of from about 2 kW to about 5 kW). Without wishing to be bound by any particular theory, it is believed that the use of these relatively low frequency RF power sources can form more uniform thin films layer compared to otherwise identical methods of sputtering except using higher frequency RF power sources (e.g., about 10 kW to about 14 kW).

As mentioned, the present system and method have particular usefulness for deposition of multiple thin film layers in the manufacture of PV modules, especially cadmium telluride thin film PV modules. FIG. 1 represents an exemplary CdTe module 10 that can be made at least in part according to system and method embodiment described herein. The module 10 includes a top sheet of glass as the substrate 12, which may be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers.

A transparent conductive oxide (TCO) layer 14 is shown on the substrate 12 of the module 10 in FIG. 1. The TCO layer 14 allows light to pass through with minimal absorption while also allowing electric current produced by the module 10 to travel sideways to opaque metal conductors (not shown). The TCO layer 14 can have a thickness between about 0.1 μm and about 1 μm, for example from about 0.1 μm to about 0.5 μm, such as from about 0.25 μm to about 0.35 μm.

A resistive transparent buffer (RTB) layer 16 is shown on the TCO layer 14. This layer 16 is generally more resistive than the TCO layer 14 and can help protect the module 10 from chemical interactions between the TCO layer 14 and the subsequent layers during processing of the module 10. In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm. In particular embodiments, the RTB layer 16 can include, for instance, a combination of zinc oxide (ZnO) and tin oxide (SnO$_2$), and is referred to as a zinc-tin oxide ("ZTO") layer 16.

The ZTO layer 16 can be fanned by sputtering, chemical vapor deposition, spraying pryolysis, or any other suitable deposition method. In particular embodiments, the ZTO layer 16 is formed by sputtering (e.g. DC sputtering or RF sputtering) on the TCO layer 14. For example, the layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., O$_2$ gas).

The CdS layer 18 is shown on ZTO layer 16 of the module 10 of FIG. 1. The CdS layer 18 is a n-type layer that generally includes cadmium sulfide (CdS) but may also include other materials, such as zinc sulfide, cadmium zinc sulfide, etc., and mixtures thereof, as well as dopants and other impurities. The CdS layer 18 may include oxygen up to about 25% by atomic percentage, for example from about 5% to about 20% by atomic percentage. The CdS layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The CdS layer 18 can be formed by sputtering, chemical vapor deposition, chemical bath deposition, and other suitable deposition methods. In one particular embodiment, the CdS layer 18 is formed by sputtering (e.g., radio frequency (RF) sputtering) onto the RTB layer 16, and can have a thickness that is less than about 0.1 μm. This decreased thickness of less than about 0.1 μm reduces absorption of radiation energy by the CdS layer 18, effectively increasing the amount of radiation energy reaching the underlying CdTe layer 20.

The CdTe layer 20 is shown on the cadmium sulfide layer 18 in the exemplary module 10 of FIG. 1. The layer 20 is a p-type layer that generally includes cadmium telluride (CdTe), but may also include other materials. As the p-type layer of the module 10, the CdTe layer 20 is the photovoltaic layer that interacts with the CdS layer 18 (i.e., the n-type layer) to produce current from the absorption of radiation energy by absorbing the majority of the radiation energy passing into the module 10 due to its high absorption coefficient and creating electron-hole pairs. The CdTe layer 20 can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the CdTe layer 20) across the junction to the n-type side (i.e., the CdS layer 18) and, conversely, holes may pass from the n-type side to the p-type side. Thus, the p-n junction formed between the CdTe layer 18 and the CdTe layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In particular embodiments, the CdTe layer 20 can have a thickness between about 0.1 μm and about 10 μm, such as from about 1 μm and about 5 μm.

A series of post-forming treatments can be applied to the exposed surface of the CdTe layer 20. These treatments can tailor the functionality of the CdTe layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the module 10) converts the normally lightly p-type doped, or even n-type doped CdTe layer 20 to a more strongly p-type layer having a relatively low resistivity. Additionally, the CdTe layer 20 can recrystallize and undergo grain growth during annealing.

Additionally, copper can be added to the CdTe layer 20. Along with a suitable etch, the addition of copper to the CdTe layer 20 can form a surface of copper-telluride ($Cu_2Te$) on the CdTe layer 20 in order to obtain a low-resistance electrical contact between the cadmium telluride layer 20 (i.e., the p-type layer) and a back contact layer(s) 22.

The back contact layer 22 generally serves as the back electrical contact, in relation to the opposite, TCO layer 14 serving as the front electrical contact. The back contact layer 22 can be formed on, and in one embodiment is in direct contact with, the CdTe layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 μm to about 10 μm in thickness, for example from about 1 μm to about 5 μm. A metal layer of the back contact, if used for or as part of the back contact layer 22, can be from about 0.1 μm to about 1.5 μm in thickness.

In the embodiment of FIG. 1, an encapsulating glass 24 is shown on the back contact layer 22.

Other components (not shown) can be included in the exemplary module 10, such as bus bars, external wiring, laser etches, etc. The module 10 may be divided into a plurality of individual cells that are connected in series in order to achieve a desired voltage, such as through an electrical wiring connection. Each end of the series connected cells can be attached to a suitable conductor, such as a wire or bus bar, to direct the photovoltaically generated current to convenient locations for connection to a device or other system using the generated electric. A convenient means for achieving the series connected cells is to laser scribe the module 10 to divide the device into a series of cells connected by interconnects. Also, electrical wires can be connected to positive and negative terminals of the PV module 10 to provide lead wires to harness electrical current produced by the PV module 10.

Figure 2:
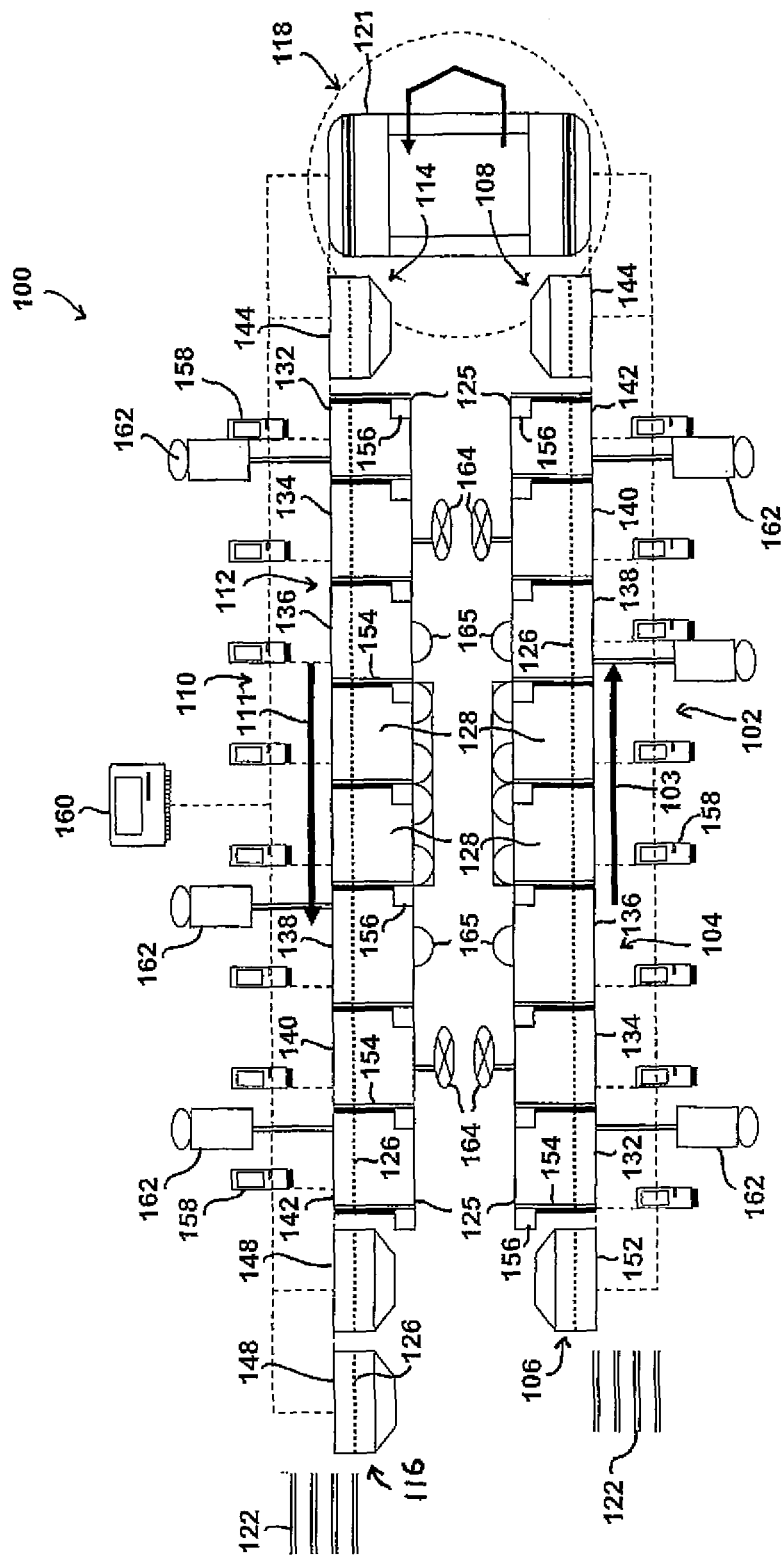
FIG. 2 shows a top plan view of an exemplary system in accordance with aspects of the invention.

FIG. 2 represents an exemplary system 100 in accordance with aspects of the invention for deposition of multiple thin film layers on PV module substrates 12 (FIG. 4) that are conveyed through the system 100. As a first matter, it should be noted that the system 100 is not limited by any particular type of thin film or thin film deposition process, as described in greater detail herein.

The illustrated system 100 includes a first processing side 102 wherein substrates loaded onto carriers 122 are conveyed in a first direction indicated by the arrow 103. First processing side 102 includes a plurality of different processing stations 104 that are configured for deposition of a first thin film layer on the substrates as the substrates are conveyed along the first processing side 102. The processing stations 104 may include serially arranged modular units that are aligned to carry out all of the processing steps necessary for deposition of the first film layer on the substrates. The carriers 122 having one or more substrates loaded thereon are introduced into the first processing side 102 at an entry location 106. The carriers 122 may be manually loaded into a load station 152 or, in an alternative embodiment, automated machinery may be used for introducing the carriers 122 into the load station 152. For example, robots or other automated machinery may be used for this process.

The carriers 122 are removed from the first processing side 102 at an opposite exit location 108, which may include an external buffer 144. Again, the carriers 122 may be manually unloaded or received by automated moving equipment, including robotic machines and the like.

The system 100 includes a second processing side 110 that is operably disposed relative to the first processing side 102 so as to convey the carriers 122 (and substrates carried thereby) that exit the first processing side 102 in a second direction indicated by the directional arrow 111 through the second processing side 110. The second processing side 110 includes a plurality of processing stations 112 that are configured and serially arranged for deposition of a second thin film layer on the first thin film layer. As with the first processing side 102, the processing modules 112 along the second processing side 110 are configured for carrying out all of the processing steps necessary for deposition of the thin film layer as the carriers 122 and substrates are conveyed through the second processing side 110.

A first transfer station 118 is operably disposed between the first processing side 102 and the second processing side 110 to receive the substrates from the exit 108 of the first processing side 102 and to automatically move the substrates to an entry 114 to the second processing side 110. The transfer station 118 may include any manner of automated machinery for accomplishing the transfer of the carriers 122. For example, the transfer station 118 may include an automated turntable 121 that is configured to receive a carrier 122 from the exit 108 of the first processing side 102, rotate counter-clockwise 180°, and to introduce the carrier 122 at the entry 144 of the second processing side 110. The turntable 121 may include any manner of robotic or other automated machinery for this purpose. In an alternative embodiment, the transfer station 118 may include any manner of conveyors that accomplish the task of receiving and conveying the carriers 122 from the exit 108 of the first processing side 102 to the entry 144 of the second processing side 110. It should be readily appreciated that any manner of transfer and conveying configuration may be utilized for this purpose.

In the illustrated embodiments, the first processing side 102 and second processing side 110 are essentially parallel to each others such that the direction of conveyance 103 and 111 of the respective processing sides are essentially parallel and opposite in direction. This arrangement may be beneficial from the standpoint of saving space in a production facility. However, it should be readily appreciated, that the second conveying direction may be disposed at any relative operational angle with respect to the axis of the first processing station 102 (including an in-line or zero angle), and that the invention is not limited to the configuration illustrated in the figures.

With the overall configuration illustrated in FIG. 2, it should readily be appreciated that the carriers 122 (with substrates) are continuously moved through the first and second processing sides 102, 110 for deposition of multiple thin film layers thereon. The configuration of FIG. 2 is an open-ended loop configuration, wherein the carriers 122 are external to the system and introduced into the first processing side 102 at the entry location 106. The carriers are subsequently removed from the system 100 at the exit location 116 of the second processing side 110. This load and unload process may be done manually or by automated machinery, as mentioned above.

Still referring to FIG. 2, the various processing stations 104, 112 may be defined by vertical processing modules 125, with each of the adjacently aligned modules 125 serving a particular processing function, as described in greater detail below. Each of the modules 125 may include an independently driven and controlled conveyor 126. The substrate carriers 122 rest on the conveyors 126 and are thereby moved in a controlled manner through the respective modules 125. In particular embodiments, the conveyors 126 may be roller-type conveyors, belt conveyors, and the like. The conveyors 126 for each of the respective modules 125 may be provided with an independent drive (not illustrated in the figure). In an alternative embodiment, a drive may be configured for driving multiple conveyors 126 of different modules 125 through any manner of gearing arrangement. A single conveyor 126 may be associated with multiple modules 125.

Figure 4:
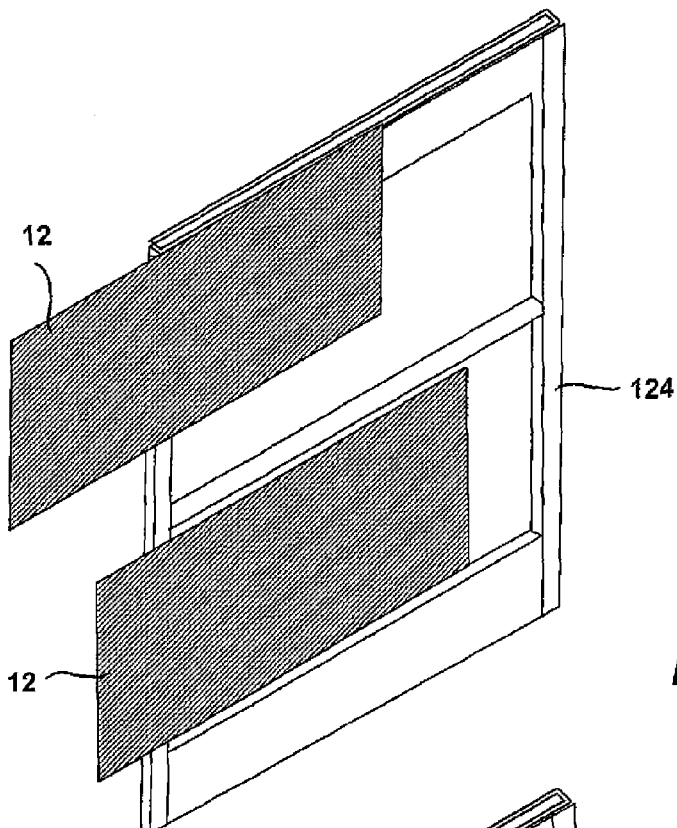
FIG. 4 is a perspective view of an embodiment of a substrate carrier configuration.

The various modules 125 are vertically oriented in that the carriers 122 convey the substrates in a vertical orientation through the processing sides 102, 110. Referring to FIG. 4, an exemplary carrier 122 is illustrated as a frame-type of structure made from frame members 124. The frame members 124 define receipt positions for substrates 12 such that the substrates 12 are horizontally or vertically received (relative to their longitudinal axis) within the carrier 122. It should be appreciated that the carrier 122 may be defined by any manner of frame structure or members so as to carry one or more of the substrates 12 in a vertical orientation through the processing sides. In the embodiment of FIG. 4, the carrier 122 is configured for receipt of two substrates 12 in a horizontal position. It should be readily appreciated that the multiple substrates 12 could also be disposed such that the longitudinal axis of the respective substrates is in a vertical position. Any orientation of the substrates 12 within the carrier 122 is contemplated within the scope and spirit of the invention. The frame members 124 may define an open-type of frame wherein the substrates 12 are essentially received within a "window opening" defined by the carrier 122. In an alternative embodiment, the carrier 122 may define a back panel against which the substrates 12 are disposed.

Figure 5:
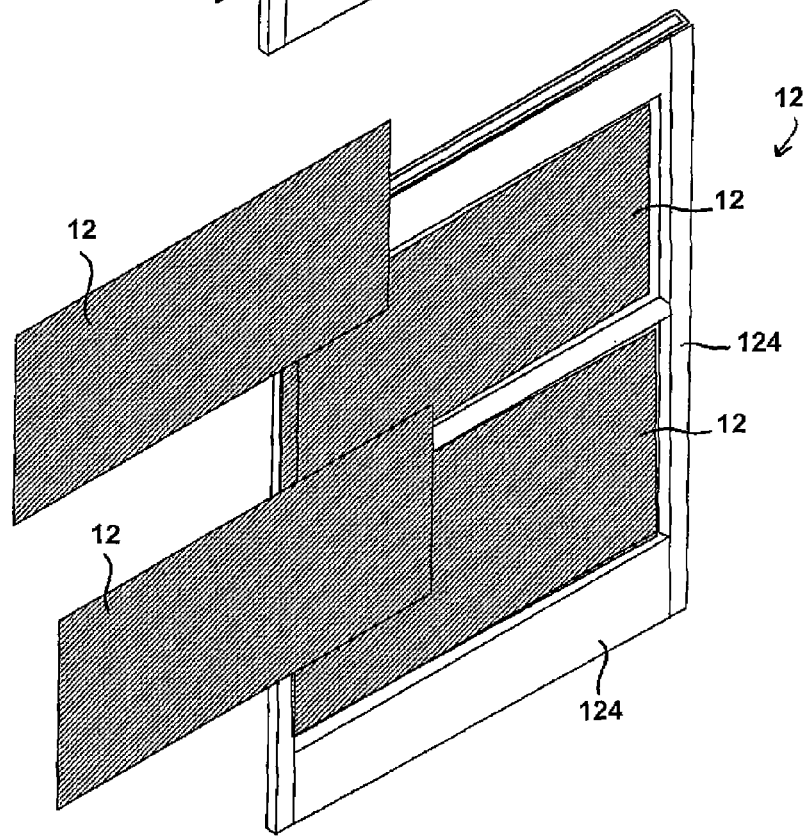
FIG. 5 is a perspective view of an alternative embodiment of a substrate carrier configuration.

The embodiment of the carrier 122 illustrated in FIG. 5 is configured for receipt of four substrates 112, wherein pairs of the substrates 12 are in a back-to-back relationship. For example, a pair of the substrates 12 is disposed in the upper frame portion of the carrier 112, and a second pair of the substrates 12 is disposed in the lower frame portion of the carrier 112. The configuration of FIG. 5 may be used when four or more of the substrates 12 are simultaneously processed in the system 100, as described in greater detail below with respect to the deposition apparatus illustrated in FIG. 7.

Referring again to FIG. 2, the first processing side 108 may be particularly configured with one or more vertical deposition modules 128 that define a vacuum sputtering chamber for deposition of a zinc-tin oxide (ZTO) layer on the substrates conveyed therethrough. Likewise, the second processing side 110 may include one or more vertical deposition modules 128 that define a vacuum sputtering chamber particularly configured for deposition of a cadmium sulfide (CDS) layer on the ZTO layer. Operation of vacuum sputtering chambers is well know to those skilled in the art and need not be described in detail herein. Basically, sputtering deposition generally involves ejecting material from a target, which is the material source, and depositing the ejected material onto the substrate in the form of a thin film layer. DC sputtering generally involves applying a voltage to a metal target (i.e., the cathode) positioned near the substrate within a chamber to form a direct-current discharge. The sputtering chamber can have a reactive atmosphere (e.g., an oxygen atmosphere) that forms a plasma field between the metal target and the substrate. The pressure of the reactive atmosphere can be between about 1 mtorr and about 20 mtorr for magnetron sputtering. When metal atoms are released from the target upon application of the voltage, the metal atoms react with the plasma and deposit onto the surface of the substrate. For example, when the atmosphere contains oxygen, the metal atoms released from the metal target form a metallic oxide layer on the substrate. RF sputtering is a process that involves exciting a capacitive discharge by applying an alternating current (AC) or radio-frequency (RF) signal between the target source material and the substrate. The sputtering chamber may have an inert atmosphere (e.g., an argon atmosphere) having a pressure between about 1 mtorr and about 20 mtorr.

FIG. 6 shows a general schematic cross-sectional view of an exemplary vertical deposition module 128 configured as an RF or DC sputtering chamber 166. A power source 168 is configured to control and supply DC or RF power to the chamber 166. In the case of a DC chamber 166, the power source 168 applies a voltage to the cathode 170 to create a voltage potential between the cathode 170 and an anode 172. In the illustrated embodiment, the anode 172 is defined by the chamber wall. The glass substrates 12 are held by the carrier 122 so as to be generally opposite from the cathode 170 (which is also the target source material 176). A plasma field 174 is created once the sputtering atmosphere is ignited and is sustained in response to the voltage potential between the cathode 170 and the chamber wall acting as the anode 172. The voltage potential causes the plasma ions within the plasma field 174 to accelerate towards the cathode 170, causing atoms from the cathode 170 to be ejected towards the surface of the substrates 12. As such, the cathode 170 is the "target" and is defined by the source material for formation of the particular type of thin film desired on the surface of the substrates 12. For example, the cathode 170 can be a metal alloy target, such as elemental tin, elemental zinc, or mixtures of different metal alloys. Oxygen in the chamber 166 reacts with the ejected target atoms to form an oxide layer on the substrates 12, such as a ZTO layer.

A cadmium sulfide (CdS) thin film layer may be formed in an RF sputtering chamber 166 (FIG. 6) by applying an alternating-current (AC) or radial-frequency (RF) signal between a ceramic target source material and the substrates 12 in an essentially inert atmosphere.

Although single power sources are illustrated in FIGS. 6 and 7, it is generally understood that multiple power sources may be coupled together with a respective target source for generating the desired sputtering conditions within the chamber 166.

FIG. 6 illustrates a heater element 178 within the chamber 166. Any manner or configuration of heater elements may be configured within the chamber 166 to maintain a desired deposition temperature and atmosphere within the chamber.

In the embodiment of FIG. 6, the vertical deposition module 128 is configured for deposition of a thin film layer on the side of the substrates 12 oriented towards the target source material 176. FIG. 7 illustrates an embodiment wherein the chamber 166 includes dual sputtering systems for applying a thin film onto the outwardly facing surfaces of the back-to-back substrates 12 secured in the carriers 122, such as the carrier 122 configuration illustrated and described above with respect to FIG. 5. Thus, with the vertical deposition module 128 illustrated in FIG. 7, four substrates are simultaneously processed for deposition of a particular thin film layer thereon.

Referring again to the system 100 in FIG. 2, the individual conveyors 126 associated with the adjacently disposed vertical deposition modules 128 are controlled so as to convey the carriers 122 and attached substrates through the vacuum sputtering chambers at a controlled, constant linear speed to ensure an even deposition of the thin film onto the surface of the substrates. On the other hand, the carriers 122 and substrates are introduced in a step-wise manner into and out of the respective processing sides 102, 110. In this regard, the system 100 includes any configuration of entry and exit modules, associated conveyors 126, and vacuum lock valves 154 with associated controllers 156. In addition, the respective processing sides 102, 110 may include additional non-vacuum modules at the respective entry and exit sides thereof for loading the carriers 112 into and out of the system 100, buffering the carriers 122 relative to the transfer station 118, and cooling-down the substrates and carriers 122 prior to removal of the substrates from the system 100.

For example, referring to FIG. 2, the first processing side 102 includes a plurality of adjacently disposed vertical processing modules 125. A first one of these modules 125 defines a load station 152 wherein the carriers 122 are loaded into the system. As mentioned, this may be done manually or robotically. A respective conveyor within the load station 152 module moves the carriers 122 to a vacuum load module 132. This module 132 includes an entry vacuum valve 154, which may be, for example, a gate-type slit valve or rotary-flapper valve that is actuated by an associated motor 156. The initial valve 154 is open and a carrier 122 is conveyed into the module 132 from the load module 152. The entry valve 154 is then closed. At this point, a "rough" vacuum pump 162 pumps from atmosphere to an initial "rough" vacuum in the millitorr range. The rough vacuum pump 162 may be, for example, a claw-type mechanical pump with a roots-type blower. Upon pumping to a defined crossover pressure, the valve 154 between the load module 132 and an adjacent load buffer module 134 is opened and the carrier 122 is transferred into the load buffer module 134. The valve 154 between the modules 132 and 134 is then closed, the load module 132 is vented, and the initial valve 154 is opened for receipt of the next carrier 122 into the module. A "high" or "fine" vacuum pump 164 draws an increased vacuum in the load buffer module 134, and the module 134 may be backfilled with process gas to match the conditions in the downstream processing chambers. The fine vacuum pump 164 may be, for example, a combination of cryopumps configured for pumping down the module to about less than or equal to $9 \times 10^{-5}$ torr.

A process buffer module 136 is downstream of the load buffer module 134 and at the prescribed vacuum pressure and conditions within the load buffer module 134, the valve 154 between these two modules is opened and the carrier 122 is conveyed into the process buffer module 136. The valve 154 between the modules 134 and 136 is then closed. The process buffer module 136 serves to essentially convert the step-wise conveyance of the carriers 122 into a controlled linear conveyance such that the leading edge of the carrier 122 is within a narrow, defined space or distance (i.e., about 20 mm) from the trailing edge of the previous carrier 122 so that the carriers 122 are conveyed through the downstream deposition modules 128 at a controlled, constant linear speed with little space between the respective carriers 122. It should thus be appreciated that, during normal production operations, the valve 154 between the process buffer module 136 and first vertical deposition module 128 is opened. Likewise, the valve 154 between the adjacent vertical deposition modules 128 is also opened. The valve 154 at the exit of the second vertical deposition module 128 is also opened. In this manner, a continuous flow of the carriers 122 through the adjacently disposed vertical deposition modules 128 at a constant processing speed is maintained.

Still referring to FIG. 2, an after-process buffer module 138 is disposed downstream of the last vertical deposition module 128 and the valve 154 between these modules is opened during normal processing. As the carriers 122 leave the vertical deposition module 128 at a controlled constant linear speed, they enter the after-process buffer module 138 and are then processed at a greater speed towards the immediately downstream exit buffer module 140. Prior to this conveyance step, the valve 154 between the modules 138 and 140 is closed and the module 140 is drawn down by the fine vacuum pump 164 and backfilled with process gas to match the processing zone conditions. Once these conditions are met, the valve 154 between the chambers is opened and the carrier 122 is transferred at a relatively higher speed into the exit buffer module 140. At a predefined crossover pressure between the module 140 and a downstream exit module 142 (which may be achieved within the module 142 by a rough vacuum pump 162), the respective valve 154 between these modules is opened and the carrier 122 is conveyed into the exit module 142. The exit module 142 may then be vented to atmosphere. At this point, the valve 154 at the exit of the module 142 is opened and the carrier 122 is conveyed into an external buffer 144.

From the external buffer 144, the carriers 122 are moved into the turntable 121 or other transfer mechanism configured at the transfer station 118. The carriers are rotated or otherwise moved at the transfer station 118 to a position for entry into an external buffer 144 at the entry point of the second processing side 110.

The process buffer module 136 and the after-process buffer module 138 may include one or more respective vacuum pump 165, such as a turbomolecular pump, mounted directly to the back of the modules for maintaining the processing vacuum pressures. Likewise, the vertical deposition modules 128 may also include any manner of vacuum pumps, such as turbomolecular pumps 165 mounted directly to the back of the modules between each of the cathode pairs associated with the respective modules.

Referring again to the system 100 of FIG. 2, the carriers 122 that are transferred to the external buffer 144 associated with the second processing side 110 are subsequently conveyed through the various vertical processing modules 125 in essentially the same manner as discussed above with respect to the first processing side 102. The operation and sequence of the various valves 154, pumps 162, 164, 165, and respective conveyors 126 is as described above for the purpose of stepping the carriers 122 in a step-wise manner into the processing modules wherein the carriers 122 are then conveyed at a constant linear speed through the vertical deposition modules 128. The vertical deposition modules 128 in the second processing side 110 are configured for deposition of a second thin film layer on the first thin film layer, for example a CdS layer, as described above.

After exiting the exit module 142 of the second processing side 110, the carriers 122 are moved into one or more cool-down stations 148 wherein the carriers and attached substrates are allowed to cool to a desired handling temperature prior to being removed from the system 100. The removal process may be manual or automated, for example with robotic machinery.

Figure 3:
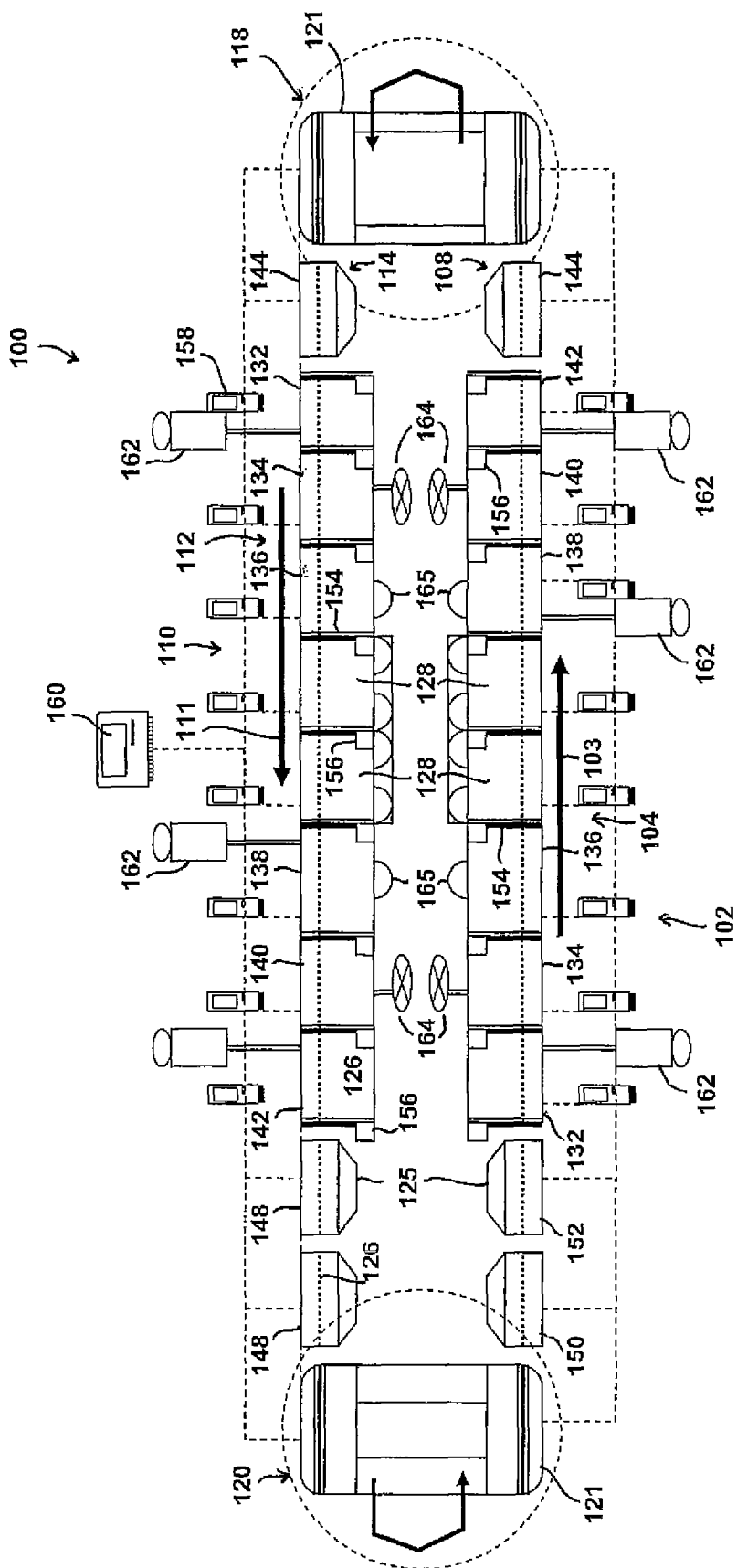
FIG. 3 shows a top plan view of an alternative system in accordance with aspects of the invention.

The system 100 in FIGS. 2 and 3 are defined by a plurality of interconnected modules, as discussed above, with each of the modules serving a particular function. The respective conveyors 126 configured with the individual modules are also appropriately controlled for various functions, as well as the valves 154 and associated actuators 156. For control purposes, each of the individual modules may have an associated controller 158 configured therewith to control the individual functions of the respective module. The plurality of controllers 158 may, in turn, be in communication with a central system controller 160. The central system controller 160 can monitor and control (via the independent controllers 158) the functions of any one of the modules so as to achieve an overall desired conveyance rate and processing of the substrates carried by the carriers 122 as they move through the system 100.

It should be readily appreciated that, although the deposition modules 128 are described herein in particular embodiments as sputtering deposition modules, the invention is not limited to this particular deposition process. The vertical deposition modules 128 may be configured as any other suitable type of processing chamber, such as a chemical vapor deposition chamber, thermal evaporation chamber, physical vapor deposition chamber, and so forth. In the particular embodiments described herein, the first processing side may be configured for deposition of a ZTO layer, with the vertical deposition modules 128 configured as reactive (using oxygen) DC vacuum sputtering chambers. Each module 128 may be configured with four DC water-cooled magnetrons. As mentioned above, each module 128 may also include one or more vacuum pumps mounted on the back chambers between each cathode pair. The vertical deposition modules 128 associated with the second processing side 110 may be configured as RF vacuum sputtering chambers, with each module 128 including three RF water-cooled magnetrons for deposition of a CdS layer from a CdS ceramic target material. These modules 128 also may include one or more vacuum pumps mounted between the cathode pairs.

FIG. 3 illustrates an alternative system 100 that is similar to the system of FIG. 2, but includes a second transfer station 120 between the exit of the second processing side 110 and the entry of the first processing side 102. This particular system thus defines a continuous loop wherein the carriers 122 are continuously conveyed in a processing loop through the system. The carriers 122 move out of the exit module 142 of the second processing station 110 and through the cool-down stations 148. The carriers 122 then move into the second transfer station 120, which may be configured as discussed above with respect to the first transfer station 118. The carriers are transferred from the last cool-down station 148 to an unload station 150 aligned with the first processing side 102. As the carriers 122 move through the unload station 150, the substrates are removed from the carriers. Again, this process may be manual or accomplished via automated robotic machinery. The empty carriers then move into a load station 152 wherein new substrates are loaded into the carriers 122. The carriers 122 and associated substrates are then processed through the first and second processing sides 102, 110, as discussed above with respect to FIG. 2. The system 100 in FIG. 3 is unique in that the process is carried out in a continuous-loop manner wherein the carriers 122 need not be removed from the system. The efficiency and through-put of the system may be significantly increased with the configuration of FIG. 3.

The through-put of the system 100 depicted in FIGS. 2 and 3 may be further increased by utilization of vertical deposition modules 128 as depicted in FIG. 7 wherein the modules 128 are essentially a combination of two separate chambers configured in facing relationship so as to deposit the thin-film layers on the surfaces of back-to-back substrates mounted within the carriers 122, as depicted in the carrier configuration of FIG. 5.

In the system 100 embodiments of FIGS. 2 and 3, a processing vacuum is separately drawn and maintained in the respective processing sides 102, 110. The carriers are removed from the vacuum processing modules 125 along the first processing side 102, transferred to the second processing side 110, and introduced into the vacuum processing modules 125 of the second processing side 110 as discussed above. It should be readily appreciated that the invention also encompasses systems 100 wherein an overall vacuum is maintained between the first processing side 102 and second processing side 110. In such a system, the carriers 122 would be buffered and transferred from one processing side to the other within a vacuum chamber.

The present invention also encompasses various process embodiments for deposition of multiple thin film layers on a photovoltaic (PV) module substrate. The processes may be practiced with the various system embodiments described above or by any other configuration of suitable system components. It should thus be appreciated that the process embodiments according to the invention are not limited to the system configuration described herein.

In a particular embodiment, the process includes conveying the substrates on carriers in a first direction through a first processing side and depositing a first thin film layer on the substrates as they move through the first processing side. The carriers are received at the exit of the first processing side and are moved to the entry of a second processing side. The carriers and attached substrates are then conveyed through the second processing side for deposition of a second thin film layer on the first thin film layer. The substrates are removed from the carriers at an unload station downstream of an exit from the second processing side and new substrates are placed onto the carriers at a load station upstream of the entry to the first processing side.

The process may include moving the carriers and attached substrates into and out of vacuum chambers along the first and second processing sides in a step-wise manner, for example through a series of vacuum locks, yet conveying the carriers and attached substrates through the vacuum chambers at a continuous linear speed during the deposition process.

In a particular embodiment, the first and second processing sides are generally parallel and the carriers are moved in a continuous loop through the first and second processing sides, with the unload and load stations being adjacent within the continuous loop.

In another embodiment, the first and second processing sides are generally parallel and the carriers are loaded at an entry to the first processing side and removed at an exit of the second processing side.

In still another process embodiment, the thin film layers are deposited within vacuum chambers defined along the first and second processing stations, and the carriers and attached substrates are moved through the system without breaking vacuum between the first and second processing sides.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of sputtering thin films on individual substrates, the method comprising:
 conveying individual substrates into a vacuum chamber to draw a sputtering pressure that is less than about 50 mTorr; and,
 conveying the individual substrates into a sputtering chamber and past a planar magnetron continuously sputtering a semiconducting target by an ionized gas at the sputtering pressure such that a thin film is formed on a surface of the individual substrate, and wherein the semiconducting target is subjected to a high frequency power having a frequency from about 400 kHz to about 4 MHz at power levels of greater than about 1 kW, wherein the semiconducting target comprises cadmium sulfide.

2. The method as in claim 1, wherein the sputtering pressure is from about 1 mTorr to about 25 mTorr.

3. The method as in claim 1, wherein the substrates are continuously conveyed at a substantially constant linear conveyance rate while sputtering.

4. The method as in claim 1, wherein the target is subjected to the high frequency power having a frequency from about 1 MHz to about 3 MHz at power levels of from about 2 kW to about 5 kW.

5. The method as in claim 1, wherein the high frequency power is supplied through an impedance matching network.

6. The method as in claim 1, wherein the semiconducting target is a planar target having a surface area greater than about 1000 cm$^2$.

7. The process as in claim 1, wherein the semiconducting target is a planar target having a surface area of about 1500 cm$^2$ to about 2500 cm$^2$.

8. The method as in claim 1, wherein the thin film formed on the surface of the individual substrate has an average thickness of about 50 nm to about 250 nm.

9. The method as in claim 8, wherein the thin film formed on the surface of the individual substrate has an average thickness of about 70 nm to about 100 nm.

10. The method as in claim 8, wherein the thin film formed on the surface of the individual substrate has a non-uniformity less than about 20% of the average thickness.

11. The method as in claim 8, wherein the thin film formed on the surface of the individual substrate has a non-uniformity of about 7% to about 15% of the average thickness.

12. The method as in claim 1, wherein the thin film is formed on the surface of the individual substrate at a rate faster than 15 nm·m$^2$/minute.

13. The method as in claim 1, wherein the frequency is selected such that magnetic field lines formed during sputtering are not closed in front of the first surface of the substrate.

14. The method as in claim 1, wherein the ionized gas comprises argon.

15. The method as in claim 1, wherein the sputtering temperature is about 20° C. to about 25° C.

16. The method as in claim 1 further comprising
 heating the individual substrates to a sputtering temperature.

17. The method as in claim 16, wherein the sputtering temperature is about 50° C. to about 150° C.

18. A method of sputtering thin films on individual substrates defining a surface having a surface area of about 1000 cm$^2$ to about 2500 cm$^2$, the method comprising:
 conveying individual substrates into a vacuum chamber to draw a sputtering pressure that is less than about 50 mTorr;
 heating the individual substrates to a sputtering temperature of about 50° C. to about 200° C.; and,
 conveying the individual substrates into a sputtering chamber and past a planar magnetron continuously sputtering a planar semiconducting target by an ionized gas at the sputtering pressure such that a thin film is formed on the surface of the individual substrate, the planar semiconducting target defining a surface area of about 1000 cm$^2$ to about 2500 cm$^2$, wherein the substrates are continuously conveyed at a substantially constant linear conveyance rate while sputtering such that the thin film formed on the surface of the individual substrate has an average thickness of about 50 nm to about 250 nm with a non-uniformity of about 7% to about 15% of the average thickness, and wherein the semiconducting target is subjected to a high frequency power having a frequency from about 400 kHz to about 4 MHz at power levels of greater than about 1 kW, wherein the semiconducting target comprises cadmium sulfide.

19. The method of claim 1, wherein a single power source is connected to the semiconducting target to supply the high frequency power.

20. The method of claim 19, wherein a single power source is connected to the semiconducting target to supply the high frequency power.

* * * * *